United States Patent [19]
Iwasa et al.

[11] Patent Number: 5,761,040
[45] Date of Patent: Jun. 2, 1998

[54] SEMICONDUCTOR DEVICE

[75] Inventors: Tatuya Iwasa, Fukuoka; Kiyoshi Arai, Tokyo, both of Japan

[73] Assignee: Mitsubishi Denki Kabushiki Kaisha, Tokyo, Japan

[21] Appl. No.: 677,833

[22] Filed: Jul. 10, 1996

[30] Foreign Application Priority Data

Dec. 20, 1995 [JP] Japan ................... 7-332125

[51] Int. Cl.$^6$ ................................. H05K 7/20
[52] U.S. Cl. .................. 361/704; 257/690; 257/724; 361/707; 361/715
[58] Field of Search ................... 257/678, 687, 257/690–692, 706, 707, 712, 713, 723, 724, 797; 361/704, 707, 714–722, 728, 733–734, 736, 772–776, 820

[56] References Cited

U.S. PATENT DOCUMENTS

| | | | |
|---|---|---|---|
| 4,907,068 | 3/1990 | Amann et al. | 257/724 |
| 5,424,579 | 6/1995 | Arai et al. | 257/690 |
| 5,471,089 | 11/1995 | Nagatomo et al. | 257/691 |
| 5,616,955 | 4/1997 | Yamada et al. | 257/690 |

FOREIGN PATENT DOCUMENTS

| | | |
|---|---|---|
| 0 116 289 | 8/1984 | European Pat. Off. |
| 0 384 482 | 8/1990 | European Pat. Off. |
| 0 427 143 | 5/1991 | European Pat. Off. |
| 0 588 094 | 3/1994 | European Pat. Off. |
| 0 609 528 | 8/1994 | European Pat. Off. |

*Primary Examiner*—Gregory D. Thompson
*Attorney, Agent, or Firm*—Oblon, Spivak, McClelland, Maier & Neustadt, P.C.

[57] ABSTRACT

Main electrodes (M10, M20, M30) are almost aligned along the length of a resin case (1). The main electrodes (M10, M20, M30) each have one main surface (inside main surface) facing the inside of the case body (101), where the insulating substrates (3A, 3B) are provided, and the other main surface (outside main surface) facing the outside of the case body (101), opposite to the side where the insulating substrates (3A, 3B) are provided. A conductor (4) is so disposed as to be opposed to the outside main surfaces of the main electrodes (M10, M20, M30). Having this configuration, a semiconductor device is provided, which enables reduction of the self-inductance without parallel arrangement of the main electrodes, achieves a high switching characteristic and ensures a stable operation and high reliability.

16 Claims, 13 Drawing Sheets

SEMICONDUCTOR DEVICE

BACKGROUND OF THE INVENTION

1. Field of the Invention

The present invention relates to a modular semiconductor device, and more particularly to a semiconductor device which achieves reduction of a self-inductance generated in a main-current path during an operation of a power switching semiconductor device.

2. Description of the Background Art

FIG. 14 is an external perspective view of a power switching semiconductor device 100 which internally has a power switching element as an example of the background-art modular semiconductor device. In FIG. 14, plate-shaped main electrodes M1 and M2, each of which serves as a path for a main current to the switching element, protrude from the inside of a resin case CS through an upper surface thereof. The respective protruding end portions of the main electrodes M1 and M2 are so bent as to be parallel to the surface of the resin case CS.

Signal terminal plates S1 and S2, each of which serves as a signal path for operation control of the switching element, also protrude through the upper surface of the resin case CS and the respective protruding end portions thereof are bent in the same manner as the main electrodes M1 and M2.

FIG. 15 is a section of the power switching semiconductor device 100 taken along the line A—A viewed from the direction of the arrow. As shown in FIG. 15, the resin case CS is so disposed as to surround a heat sink HS for radiating heat generated by the switching element SW during the operation. Further, an insulating substrate BS is mounted on the heat sink HS.

The insulating substrate BS has a prescribed circuit pattern formed on its upper main surface, where the switching element SW is mounted and an electrical connection is made with the main electrodes M1 and M2, the signal terminal plates S1 and S2 and the like. The insulating substrate BS has a thin metal formed on its lower main surface, which is mounted on the heat sink HS by soldering.

The internal space surrounded by the resin case CS and the heat sink HS is filled with a first resin J1 and a second resin J2 (crosshatching is omitted in this figure) in a layered-structure in this order from the side of the heat sink HS. The first and second resins J1 and J2 are different from each other in material and property: the first resin J1, such as a silicone resin, being soft and electrically insulative, protects internal components of the power switching semiconductor device 100; the second resin J2, such as an epoxy resin, being hard and electrically insulative, protects the first resin J1.

In general, the power switching semiconductor device for small current carries the main current of 20 to 30 amp flowing in the switching element, and the power switching semiconductor device for large current carries more than 100 amp. Accordingly, an ill effect that a self-inductance generated in the main electrodes produces in the switching operation is not negligible. For less self-inductance, a parallel arrangement of the two main electrodes with a prescribed spacing therebetween is adopted.

FIG. 16 is a perspective view showing an arrangement of the main electrodes M1 and M2 in the power switching semiconductor device 100. This figure does not show elements other than the main electrodes M1 and M2, the heat sink HS and the insulating substrate BS.

In FIG. 16, one end portion of each of the main electrodes M1 and M2 which protrudes through the upper surface of the resin case CS is a single terminal, and the other end portion located inside the case extends, separating in two opposite directions at some midpoint and then being brought closer again in a curve of 180°, and is bent towards the insulating substrate BS to be brought into contact therewith at a prescribed position of the circuit pattern. The main electrode M1 is parallelly disposed under the main electrode M2 with a prescribed spacing, and most portions of them entirely overlap each other.

The curved structure at 180°, rather than linear structure, of the main electrodes M1 and M2 produces an effect of absorbing a mechanical stress in fabrication and a thermal stress during the operation to ensure a reliable joint between the main electrodes M1 and M2 and the circuit pattern of the insulating substrate BS which are in contact with each other.

As discussed above, in the power switching semiconductor device 100, the main electrodes M1 and M2 are arranged in parallel to each other with a prescribed spacing in order to reduce the self-inductance generated therein. For less self-inductance, the main electrodes M1 and M2 are required to be as precisely parallel as possible to each other. The self-inductance are less reduced as the main electrodes M1 and M2 becomes not so precisely parallel.

On the other hand, the curved structure for absorbing stresses requires the main electrodes M1 and M2 to be lengthened. It becomes more difficult to keep the main electrodes M1 and M2 precisely parallel to each other as they become longer.

A large amount of self-inductance generated in the main electrodes M1 and M2 due to unprecise parallel arrangement deteriorates the switching characteristics of the switching elements, and at the worst, a spike voltage generated at the turn-off of the switching elements causes a breakdown of the switching element.

The curved structure tends to deform though effective in absorbing stresses. Variation in the spacing between the overlapped main electrodes M1 and M2 due to the deformation of the main electrodes M1 and M2 causes variation in the self-inductance. One of the causes of the deformation is heat from the switching elements. After starting the device operation, the temperature of the first resin J1 rises with time and the expanded first resin J1 brings the main electrodes M1 and M2 to be deformed, causing variation in the self-inductance with time. That results in an unstable operation of the power switching semiconductor device 100 leading to loss in reliability of products.

SUMMARY OF THE INVENTION

The present invention is directed to a semiconductor device. According to a first aspect of the present invention, the semiconductor device comprises: a resin case being box-shaped and electrically insulative and having a bottom a circuit board provided on the having a prescribed circuit pattern; a power semiconductor element provided on the circuit board; and at least one pair of main electrodes, each of the main electrodes having a first main surface and a second main surface which are opposite to each other, and one end electrically connected to the power semiconductor element and the other end protruding outside through an upper surface of the resin case, the pair of main electrodes flowing a main current from the power semiconductor element in opposite directions. A heat sink for radiating heat generated during an operation of the power semiconductor element. At least one pair of the main electrodes are so arranged as not to be overlapped to each other. The semiconductor device of the first aspect further comprises a first conductor plate opposed to the first main surfaces of at least one pair of the main electrodes with a prescribed spacing.

According to a second aspect of the present invention, the semiconductor device of the first aspect further comprises: a second conductor plate opposed to the second main surfaces of at least one pair of the main electrodes with a prescribed spacing.

According to a third aspect of the present invention, in the semiconductor device of the first or second aspect, at least one pair of the main electrodes are arranged so that the second main surfaces may face a side in which the power semiconductor element is mounted and the first main surfaces may face the opposite side, and the first conductor plate is arranged so that its edge portion may be engaged with the heat sink.

According to a fourth aspect of the present invention, in the semiconductor device of the first or second aspect, at least one pair of the main electrodes are arranged so that the second main surfaces may face a side in which the power semiconductor element is mounted and the first main surfaces may face the opposite side, and the first conductor plate is formed integrally with the heat sink.

According to a fifth aspect of the present invention, in the semiconductor device of the second aspect, at least one of the first and second conductor plates and at least one pair of the main electrodes are fixed inside a side wall of the resin case by resin sealing.

According to a sixth aspect of the present invention, in the semiconductor device of the second aspect, at least one pair of the main electrodes are fixed inside a side wall of the resin case by resin sealing, the resin case includes a pocket provided inside its side wall correspondingly to a position to be provided with at least one of the first and second conductor plates for accommodating at least one of the first and second conductor plates, and at least one of the first and second conductor plates is inserted into the pocket.

According to a seventh aspect of the present invention, in the semiconductor device of the second aspect, the first and second conductor plates each have a diamagnetic material as a main material; and a ferromagnetic layer formed over a surface of the main material.

According to an eighth aspect of the present invention, in the semiconductor device of the second aspect, the first and second conductor plates each have a paramagnetic material as a main material; and a ferromagnetic layer formed over a surface of the main material.

According to a ninth aspect of the present invention, in the semiconductor device of the second aspect, the first and second conductor plates are each made of paramagnetic material.

According to a tenth aspect of the present invention, in the semiconductor device of the second aspect, the first and second conductor plates are each made of ferromagnetic material.

The semiconductor device of the first aspect of the present invention, having at least one pair of the main electrodes which are not overlapped with each other and the first conductor plate opposed to the first main surfaces of the main electrodes with the prescribed spacing, generates the magnetizing current in the first conductor plate through the magnetic induction in response to the main current to counteract the magnetic fields in the main electrodes, thereby reducing the self-inductance. In order to achieve this effect, it is required only to provide the first conductor plate so as to be opposed to the first main surfaces of at least one pair of the main electrodes, but it is not necessary that the first conductor plate should be precisely in parallel to the main electrodes. That ensures more flexible arrangement of the main electrodes.

The semiconductor device of the second aspect of the present invention, having the second conductor plate opposed to the second main surfaces of at least one pair of the main electrodes with the prescribed spacing, makes it possible to counteract the magnetic field that can not be counteracted by only the first conductor plate, thus further reducing the self-inductances in the main electrodes.

The semiconductor device of the third aspect of the present invention, in which the edge portion of the first conductor plate is engaged with the heat sink, suppresses a rise in temperature of the first conductor plate by transmitting the heat of the first conductor plate to the heat sink through thermal conduction.

The semiconductor device of the fourth aspect of the present invention, in which the first conductor plate and the heat sink are integrally formed, achieves a higher effect of radiating the heat of the first conductor plate.

The semiconductor device of the fifth aspect of the present invention enables size reduction since at least one of the first and second conductor plates and at least one pair of the main electrodes are resin-sealed inside the side wall of the resin case.

The semiconductor device of the sixth aspect of the present invention, in which at least one pair of the main electrodes are resin-sealed inside the side wall of the resin case and the pocket for accommodating at least one of the first and second conductor plates is provide inside the side wall of the resin case, ensures simple manufacturing process since at least one of the first and second conductor plates only has to be inserted into the pocket for complete arrangement.

The semiconductor device of the seventh aspect of the present invention, including the first and second conductor plates each with the ferromagnetic layer formed over the surface of their main material, sufficiently reduces the self-inductance in the main electrodes even if it is made mainly of diamagnetic material which provides excellent thermal conductivity and cost efficiency.

The semiconductor device of the eighth aspect of the present invention, including the first and second conductor plates each with the ferromagnetic layer formed over the surface of their main material, sufficiently reduces the self-inductance in the main electrodes even if it is made mainly of paramagnetic material which provides excellent thermal conductivity and cost efficiency.

The semiconductor device of the ninth aspect of the present invention, including the first and second conductor plates each of which is made mainly of paramagnetic material, generates the magnetizing current in the conductor plates to cause the magnetic field in such a direction as counteract the magnetic fields in the main electrodes, thereby fully reducing the self-inductances in the main electrodes.

The semiconductor device of the tenth aspect of the present invention, including the first and second conductor plates each of which is made mainly of ferromagnetic material, generates the magnetizing current in the conductor plates to cause the magnetic field in such a direction as counteract the magnetic fields in the main electrodes, thereby fully reducing the self-inductances in the main electrodes.

An object of the present invention is to provide a semiconductor device which enables reduction of a self-inductance, achieves excellent switching characteristics and ensures a stable operation leading to high reliability, without a parallel arrangement of the main electrodes.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. The First Preferred Embodiment>

Figure 1:
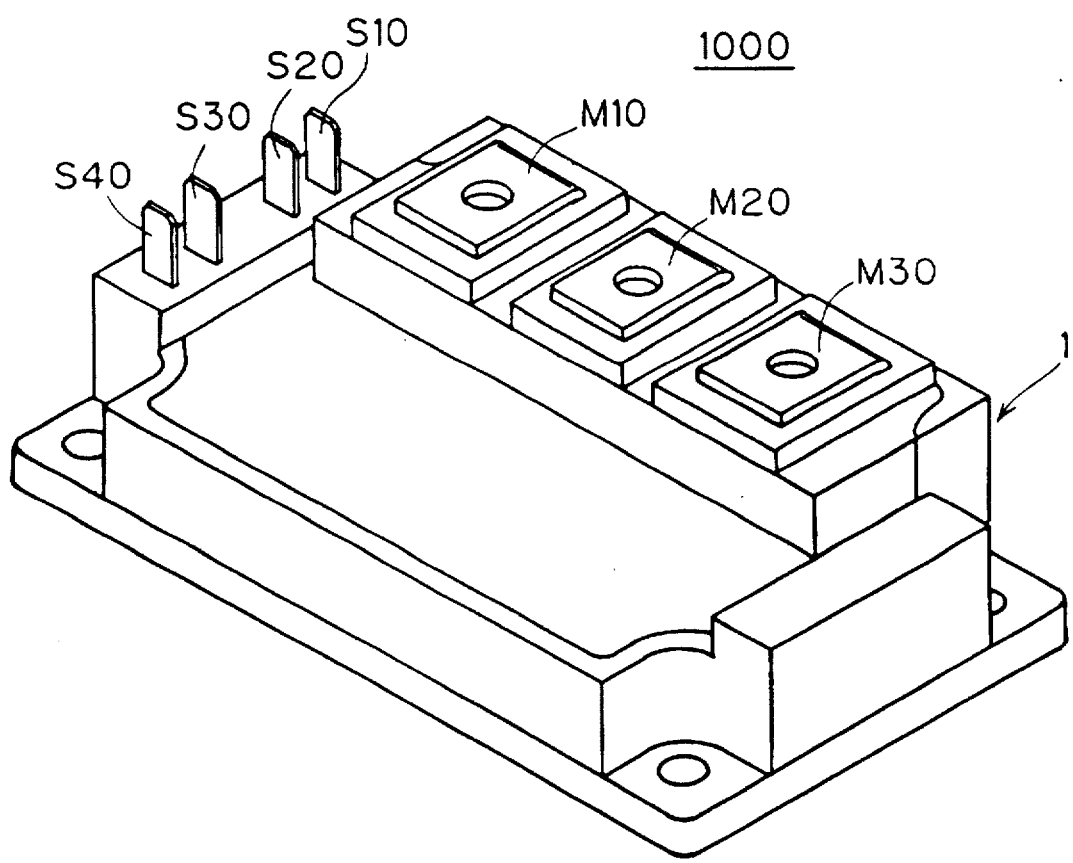
FIG. 1 is an external perspective view of a semiconductor device in accordance with a first preferred embodiment of the present invention.

FIG. 1 is an external perspective view of a power switching semiconductor device 1000 internally having a power switching element (power semiconductor element) as an example of a semiconductor device in accordance with the first preferred embodiment of the present invention. In FIG. 1, plate-shaped main electrodes M10 to M30, each of which serves as a current path for a main current of the switching element, protrude through an upper surface of a resin case 1 from the inside, and the respective protruding end portions are bent so as to be parallel to the surface of the resin case 1. The main electrodes M10 to M30 are disposed along the length of the resin case 1 and the respective bent portions over the resin case 1 are almost aligned. Signal terminal plates S10 to S40, each of which serves as a signal path for operation control of the switching element, also protrude through the upper surface of the resin case 1.

Figure 2:
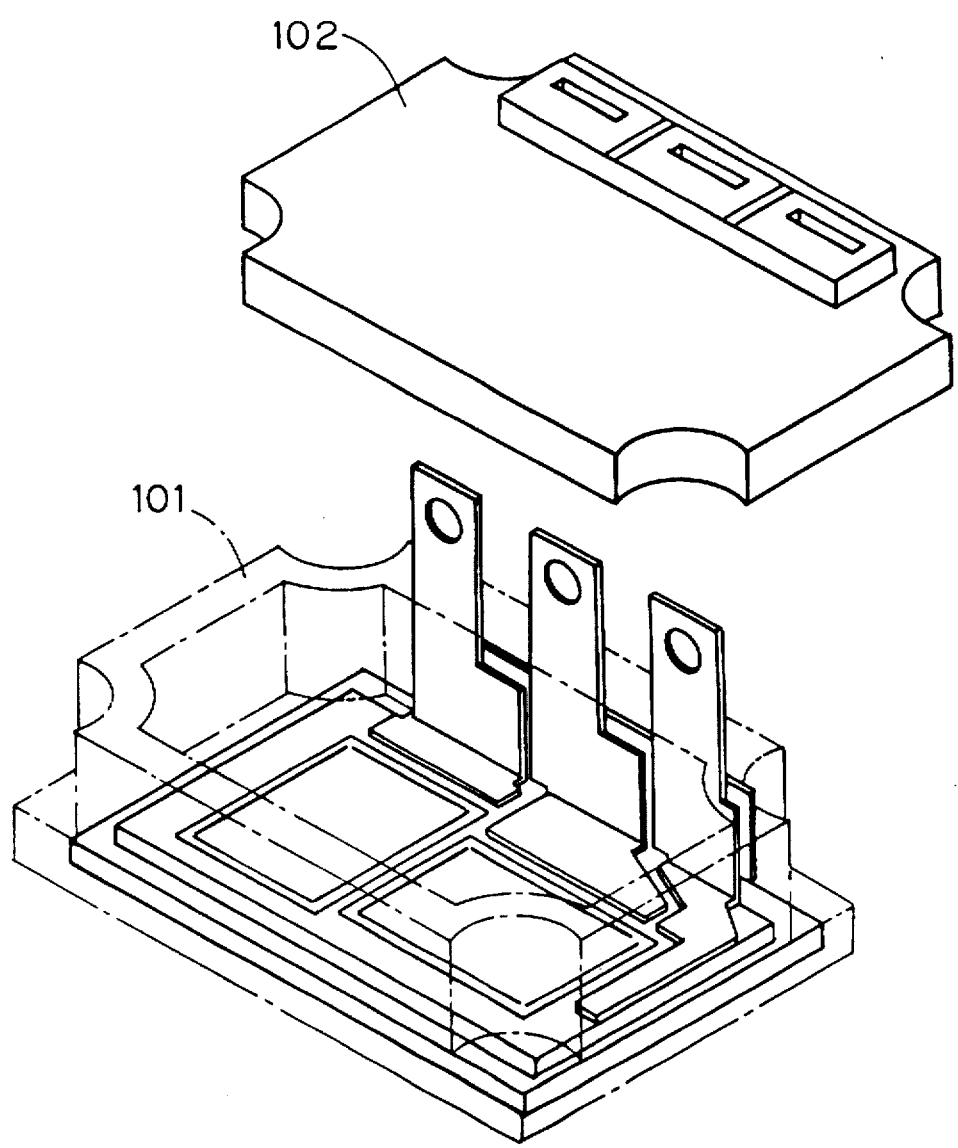
FIG. 2 is an exploded perspective view of the semiconductor device in accordance with the first preferred embodiment of the present invention.

FIG. 2 is an exploded perspective view of the power switching semiconductor device 1000. As shown in FIG. 2, the resin case 1 consists of a case body 101 and a case cover 102 which is independent thereof, and taking off the case cover 102 reveals the inside of the device.

Figure 3:
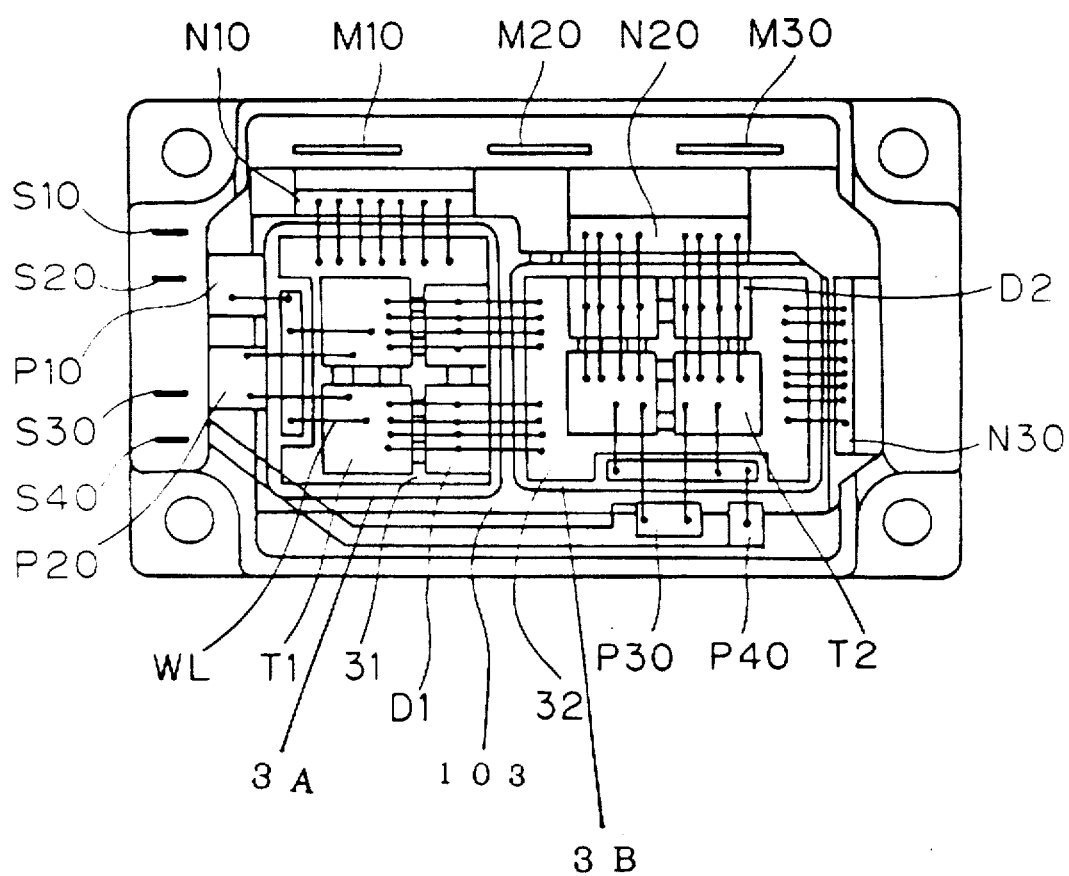
FIG. 3 is an internal view of the semiconductor device in accordance with the first preferred embodiment of the present invention.

FIG. 3 is a plan view showing an internal configuration of the power switching semiconductor device 1000, with the case cover 102 taken off. Since the device is filled with a resin, the switching element and the like does not actually appear even when the case cover 102 is taken off, but the resin is omitted herein for convenience of illustration.

In FIG. 3, switching elements T1, T2 and diodes D1 and D2 are mounted on insulating substrates (circuit boards) 3A and 3B each provided with a prescribed circuit pattern which is made of conductive foil. The insulating substrates 3A and 3B are provided with conductive foils 31 and 32 thereon, respectively, and the switching elements T1 and the diodes D1 are mounted on the conductive foil 31 and the switching elements T2 and the diodes D2 are mounted on the conductive foil 32. The insulating substrates 3A and 3B are mounted on a heat sink 2 (see FIG. 5) for radiating heat generated during operations of the switching elements T1 and T2 and the diodes D1 and D2. Further, the insulating substrates 3A and 3B are surrounded by a case bottom 103, being fit into an opening of the case bottom 103.

FIG. 3 shows two parallelly-connected switching elements T1, switching elements T2, diodes D1 and diodes D2. Furthermore, electrical connection is established with wire lines WL (bonding wires) between the switching elements T1 and diodes D1, and between the switching elements T2 and the diodes D2.

Most portions of the main electrodes M10 to M30 are embedded in a side wall of the case body 101, except the protruding portions over the resin case 1 and the portions serving as terminal plates N10 to N30 inside the case body 101.

The terminal plate N10 is one of the end portions of the main electrode M10. The terminal plate N20 is one of the end portions of the main electrode M20. The terminal plate N30 is one of the end portions of the main electrode M30. The terminal plates N10, N20 and N30 are electrically connected to the conductive foil 31, the diode D2 and the conductive foil 32, respectively.

The signal terminal plates S10, S20, S30 and S40 are connected through the inside of the side wall of the case body 101 to terminal plates P10, P20, P30 and P40 disposed inside the case body 101, respectively.

Figure 4:
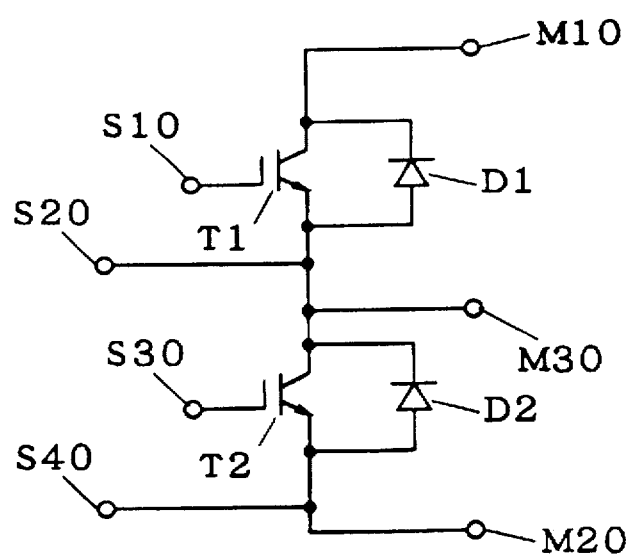
FIG. 4 is a diagram showing a circuit configuration of the semiconductor device in accordance with the first preferred embodiment of the present invention.

FIG. 4 shows a circuit configuration of the power switching semiconductor device 1000. In FIG. 4, the switching elements T1 and T2 (IGBTs: Insulated Gate Bipolar Transistors) are connected in series to each other. The collector electrode of the switching element T1 is connected to the main electrode M10 and the emitter electrode of the switching element T2 is connected to the main electrode M20. The emitter electrode of the switching element T1 and the collector electrode of the switching element T2 are connected in common to the main electrode M30.

The switching elements T1 and T2 are connected in inverse-parallel to the diodes D1 and D2, respectively. The main electrode M30 is connected to an external inductive load, such as a motor.

The gate electrodes of the switching elements T1 and T2 are connected to the signal terminal plates S10 and S30, respectively. The signal terminal plate S20 is connected to the emitter electrode of the switching element T1, serving as an emitter auxiliary terminal to check a voltage of the emitter electrode. The signal terminal plate S40 is connected to the emitter electrode of the switching element T2, serving as an emitter auxiliary terminal to check a voltage of the emitter electrode.

As can be understood from FIG. 4, the collector current (the main current) of the switching elements T1 and T2 flows in the main electrodes M10 to M30. In other words, a large amount of current for power supply to the external load flows in the main electrodes M10 to M30. On the other hand, a much smaller amount of the gate current flows in the signal terminal plates S10 and S30, and no current, in principle, flows in the signal terminal plates S20 and S40.

Alternate supply of the gate current to the signal terminal plates S10 and S30 turns the switching elements T1 and T2 on and off alternately. As a result, the main current in the main electrodes M10 and M30 and that in the main electrodes M20 and M30 flow in opposite directions. Specifically, while the switching element T1 turns on, the main current flows from the main electrode M10 to the main electrode M30, and while the switching element T2 turns on, the main current flows from the main electrode M30 to the main electrode M20.

As mentioned above, since a large amount of current, e.g., more than 100 amp, flows in the main electrodes M10 to M30, a self-inductance which is not negligible in quantity is generated. The self-inductance in the main electrode M30 is negligible since the main electrode M30 is connected to the inductive load whose inductance is so much larger than the self-inductance. The self-inductances in the main electrodes M10 and M20 are not negligible for the above reason.

Figure 5:
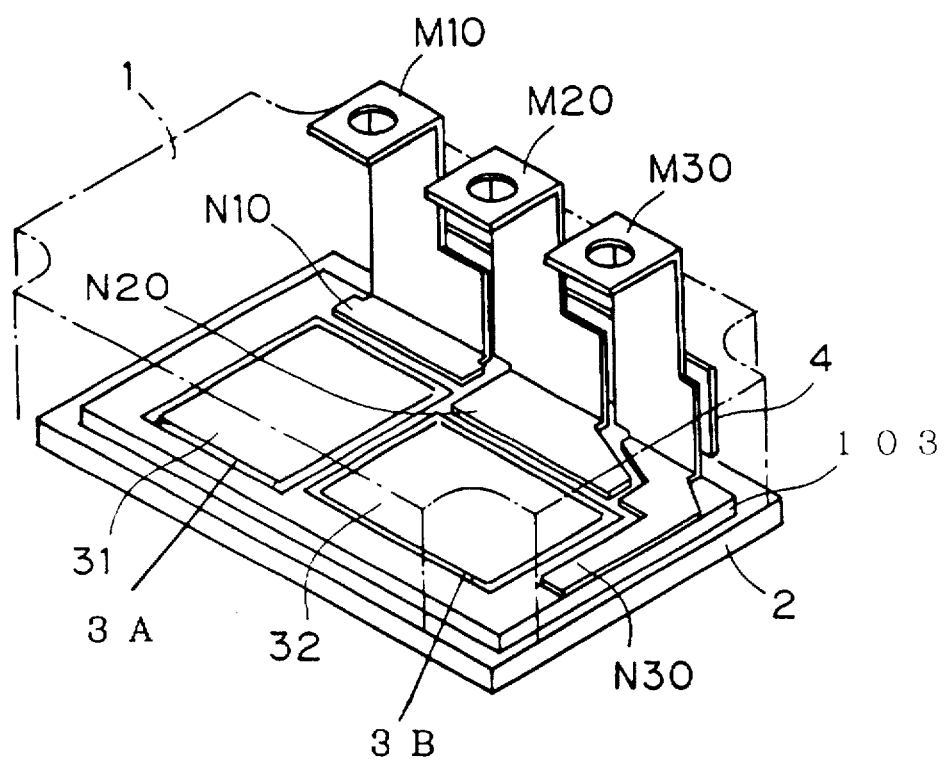
FIG. 5 is a perspective view showing an arrangement of a conductor plate in the semiconductor device in accordance with the first preferred embodiment of the present invention.

FIG. 5 is a perspective view showing a configuration of the main electrodes M10 to M30 and a conductor plate 4 arranged so as to be parallelly opposed thereto, omitting the case body 101. In FIG. 5, the insulating substrates 3A and 3B are mounted on an upper surface of the heat sink 2 and the conductive foils 31 and 32 are disposed on upper surfaces of the insulating substrates 3A and 3B, respectively. The terminal plates N10 to N30 which are the respective one ends of the main electrodes M10 to M30 are provided on the case bottom 103. Other elements are not shown in this figure and not discussed herein because of little concern with the present invention. Although the case bottom 103 and the case body 101 are formed in one united body thus not being separated, the case bottom 103 is shown as an independent plate for simple discussion.

The main electrodes M10 to M30 are almost aligned along the length of the resin case body 101, so main surfaces thereof may be almost coplaner. One of the main surfaces of each of the main electrodes M10 to M30 facing the inside of the case body 101, that is, a side in which the insulating substrates 3A and 3B are disposed, will be hereinafter referred to as "inside main surface", and the other main surface facing the outside of the case body 101, opposite to the side in which the insulating substrates 3A and 3B are disposed, will be hereinafter referred to as "outside main surface". The conductor plate 4 is disposed so that its main surface is partly opposed to the outside main surfaces of the main electrodes M10 to M30.

Figure 6:
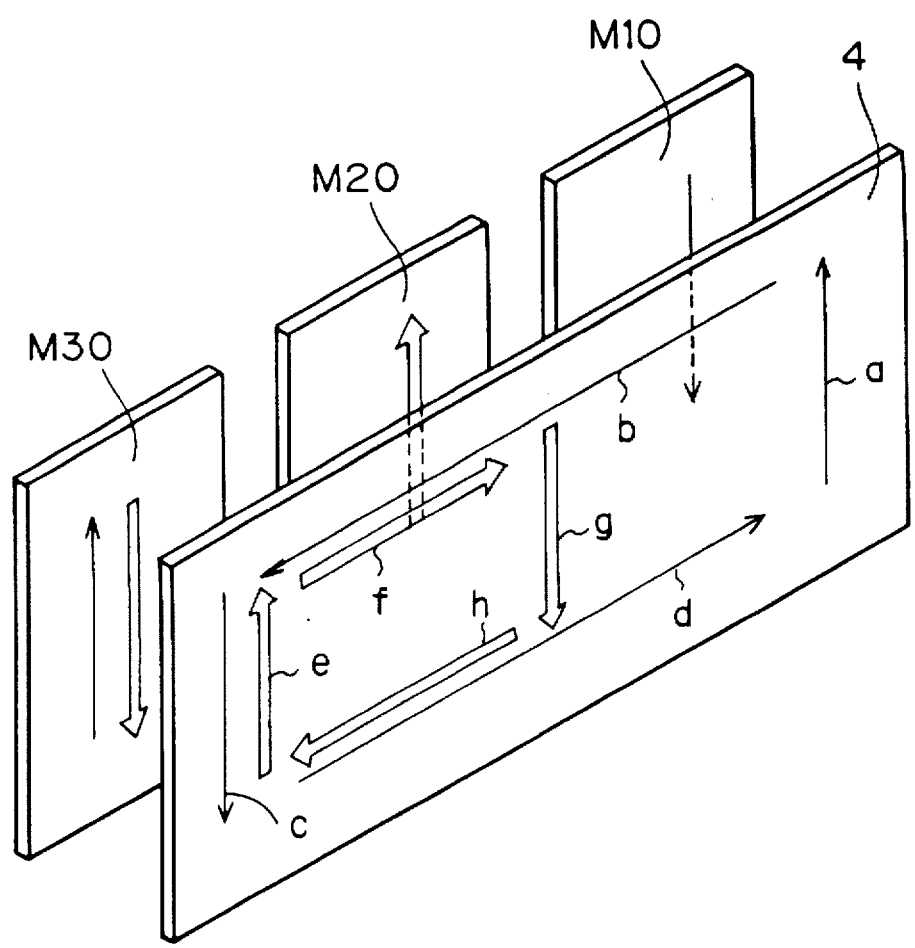
FIG. 6 is a schematic view illustrating a function of the conductor plate of the semiconductor device in accordance with the first preferred embodiment of the present invention.

Referring to a schematic view of FIG. 6 illustrating the main electrodes M10 to M30 and the conductor plate 4, the function and effect produced by providing the conductor plate 4 will be discussed.

While the switching element T1 turns on, the main current flows from the main electrode M10 to the main electrode M30. The flow of the main current is represented by an arrow. Specifically, the main current flows in the main electrode M10 in a direction indicated by a downward arrow and flows in the main electrode M30 in a direction indicated by an upward arrow. When a current flows in a conductor, in general, a magnetic field is generated around the current. Accordingly, a magnetic field is generated around the main electrodes M10 and M30.

While the switching element T2 turns on, the main current flows from the main electrode M30 to the main electrode M20. The flow of the main current is represented by a blank arrow.

At this time, if another conductor, i.e., the conductor plate 4, is disposed near the main electrodes M10 to M30, the conductor plate 4 is magnetized through magnetic induction. A substance needs a flow of current therein to generate a magnetic flux. In this case, however, no current, in an ordinary meaning, flows in the substance. Electrons each make an orbital motion around a nucleus in each atom and a rotating (spin), which generate apparent microcurrent loops. The microcurrent loops turn in random directions, and there apparently exists no magnetic moment unless a magnetic field is externally applied. When the magnetic field is externally applied, the microcurrent loops move to be aligned in one direction in accordance with the applied magnetic field, thereby generating a magnetic field opposite in direction to the external magnetic field.

Specifically, a current which is apparently opposite in direction to the main current in the main electrode M10 flows in a portion of the conductor plate 4 corresponding to the main electrode M10. This current is termed a magnetizing current.

Accordingly, while the switching element T1 turns on, the magnetizing current flows opposite in direction to the main current as indicated by the arrow a in a portion of the conductor plate 4 corresponding to the main electrode M10 and the magnetizing current flows opposite in direction to the main current as indicated by the arrow c in a portion of the conductor plate 4 corresponding to the main electrode M30. Consequently, the magnetic fields generated in the main electrodes M10 and M30 are weakened, and the self-inductances generated in the main electrodes M10 and M30 are reduced. Furthermore, a current path for the magnetizing current in the conductor plate 4 would be that indicated by a series of arrows a-b-c-d-a.

Similarly, while the switching element T2 turns on, the magnetizing current flows opposite in direction to the main current as indicated by the arrow g in a portion of the conductor plate 4 corresponding to the main electrode M20 and the magnetizing current flows opposite in direction to the main current as indicated by the arrow e in a portion of the conductor plate 4 corresponding to the main electrode M30. Consequently, the magnetic fields generated in the main electrodes M20 and M30 are weakened, and the self-inductances generated in the main electrodes M20 and M30 are reduced. Furthermore, a current path for the magnetizing current in the conductor plate 4 would be that indicated by a series of arrows e-f-g-h-e.

In a circuit having the configuration of FIG. 4, in general, the switching elements T1 and T2 alternately turn on and off at high speed. There is a slight time lag from the generation of the magnetic field by the main current to the generation of the magnetizing current by the magnetic field. If the time needed for the switching operation of the switching elements T1 and T2 is much shorter than the time lag, a magnetizing current indicated by the arrow a which is generated by the main current in the main electrode M10 and a magnetizing current indicated by the arrow g which is generated by the main current in the main electrode M20 exist almost simultaneously in the conductor plate 4.

Accordingly, during a high-speed switching operation of the switching elements T1 and T2, the magnetizing currents which flow almost simultaneously in opposite directions counteract each other, leaving a current path a-b-g-d-a.

Although the self-inductance in the main electrode M30 is not reduced since no magnetizing current exists in a portion of the conductor plate 4 corresponding to the main electrode M30, there arises no problem because the main electrode M30 is connected to the inductive load, as discussed earlier, and would have little effect if the self-inductance of the main electrode M30 can be reduced.

Thus, by providing the conductor plate 4 to be opposed to the outside main surfaces of the main electrodes M10 to M30, the magnetizing current is generated in the conductor plate 4 through the magnetic induction and causes a magnetic field to counteract the magnetic fields in the main electrodes M10 and M20. As a result, the self-inductances of the main electrodes M10 and M20 can be reduced.

As to a material for the conductor plate 4, a ferromagnetic material which allows high magnetic field to be generated by the magnetizing current, such as iron, nickel, cobalt, and alloy containing at least one kind of these materials, a paramagnetic material, such as aluminum and platinum, and a diamagnetic material, such as copper, silver and lead, may be used. In consideration of electrical conductivity, thermal conductivity and cost efficiency, the conductor plate 4 is often made mainly of copper which is a diamagnetic material with a layer of nickel formed over its surface. Naturally, the conductor plate 4 may be made mainly of aluminum which is a paramagnetic material with a layer of nickel formed over its surface.

It is desirable that the conductor plate 4 should be arranged in parallel to the main surfaces of the main electrodes M10 and M30, but the self-inductance can be reduced even if they are not precisely in parallel. That ensures an easier process of embedding the conductor plate 4 and the main electrodes M10 to M30 into the case body 101 of the resin case 1.

That also allows a configuration where the conductor plate 4 may be inserted into a pocket provided inside the side wall of the resin case 101 correspondingly to the position to be provided with the conductor plate 4 for accommodating it, instead of being embedded into the case body 101. Conventionally, there has been a difficulty in providing the pocket to accommodate the conductor plate 4 precisely in parallel to the main electrodes M10 to M30.

On the other hand, the narrower the spacing between the conductor plate 4 and the main electrodes M10 to M30 and the wider the conductor plate 4, the higher the effect of reducing the self-inductance. Accordingly, when a conductor plate 4 which has an area as wide as possible corresponding to the main surfaces of the main electrodes M10 to M30 is opposed to the main electrodes M10 to M30 with a spacing as narrow as possible, to such an extent as not to come into contact therewith, it is possible to produce the maximum effect of reducing the self-inductance. One of the methods of arranging the conductor plate 4 and the main electrodes M10 to M30 with as narrow a spacing as possible is interposing an insulating sheet therebetween. Since an insulating sheet of any thickness can be prepared, it is possible to determine the thickness, in other words, the spacing between the conductor plate 4 and the main electrodes M10 to M30 in accordance with heat resistance and mechanical strength.

Furthermore, it is not necessarily required in the power switching semiconductor device 1000 that the main electrodes M10 to M30 should be almost aligned along the length of the resin case so that their main surfaces may be almost coplaner, though such configuration has been discussed above as an example. Even in another case, such as a case where the main surface of the main electrode M20 is located on the inner side or outer side of the main surface of the main electrode M10, where the main electrodes M10 and M20 are inverted in positional relation, and where the main surface of the main electrode M20 is turned 90° relatively to the main surface of the main electrode M10, the self-inductance can be reduced by providing a conductor plate which is deformed in accordance with the arrangement of the main electrodes M10 to M30.

Thus, the power switching semiconductor device 1000 of this preferred embodiment achieves reduction of the self-inductance generated in the main electrodes M10 and M20. Moreover, it is not needed to arrange the main electrodes to be opposed to each other as conventionally required, but it is needed only to provide the conductor plate 4 to be opposed to the outside main surfaces of the main electrodes M10 to M30 in order to achieve the above effect. Since there is little limitation in arrangement of the main electrodes M10 to M30, it is possible to embed the main electrodes M10 to M30 into the side wall of the resin case 1. Therefore, size reduction of the device can be achieved.

<B. The Second Preferred Embodiment>

Figure 7:
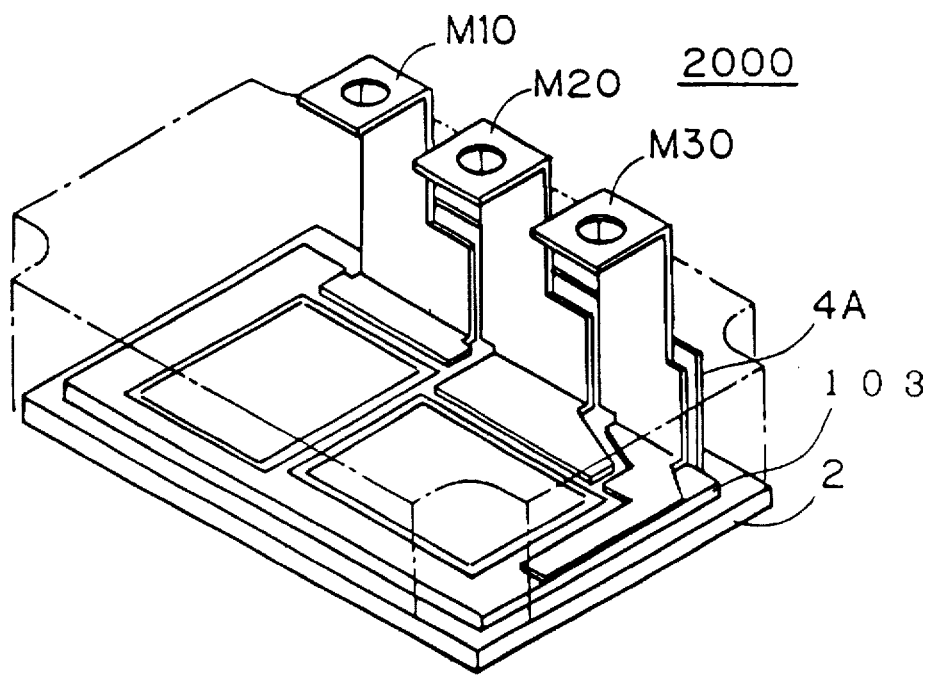
FIG. 7 is a perspective view showing an arrangement of a conductor plate in a semiconductor device in accordance with a second preferred embodiment of the present invention.

FIG. 7 is a perspective view showing a configuration of a power switching semiconductor device 2000 as an example of a semiconductor device in accordance with the second preferred embodiment of the present invention. The case body 101 is not shown in FIG. 7, and the same elements as those of the power switching semiconductor device 1000 of FIGS. 1 to 5 will not be discussed.

In FIG. 7, a conductor plate 4A is so arranged as to be opposed to the outside main surfaces of the main electrodes M10 to M30. The power switching semiconductor device 2000 of this preferred embodiment has a configuration where a lower end of the conductor plate 4A is engaged with the heat sink 2, unlike the power switching semiconductor device 1000 of FIGS. 1 to 5. For engagement, the conductor plate 4A and the heat sink 2 may be only brought into contact with each other, or may be bonded by soldering or with an adhesive.

The heat sink 2 radiates heat generated by the switching elements T1 and T2 and the diodes D1 and D2 during the operation, and for this reason, it is made mainly of, for example, copper with a layer of nickel formed over its surface. Therefore, the configuration where the conductor plate 4A is engaged with the heat sink 2 enables reduction of the self-inductance generated in the main electrodes M10 and M20 and moreover suppresses a rise in the temperature of the conductor plate 4A since the heat of the conductor 4A, which is given by the main electrodes M10 to M30 and generated therein (due to the magnetizing current), is transmitted to the heat sink 2. Other effects of the power switching semiconductor device 2000 are the same as those of the power switching semiconductor device 1000.

<C. The Third Preferred Embodiment>

Figure 8:
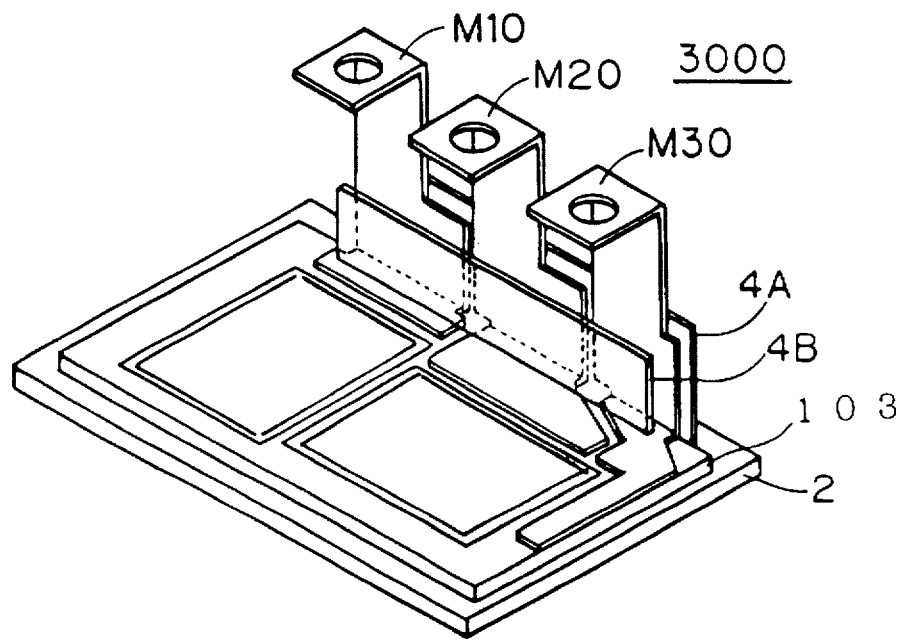
FIG. 8 is a perspective view showing an arrangement of conductor plates in a semiconductor device in accordance with a third preferred embodiment of the present invention.

FIG. 8 is a perspective view showing a configuration of a power switching semiconductor device 3000 as an example of a semiconductor device in accordance with the third preferred embodiment of the present invention. The case body 101 is not shown in FIG. 8, and the same elements as those of the power switching semiconductor device 1000 of FIGS. 1 to 5 will not be discussed.

In FIG. 8, the conductor plate 4A is so disposed as to be opposed to the outside main surfaces of the main electrodes M10 to M30, and a conductor plate 4B is so disposed as to be opposed to the inside main surfaces of the main electrodes M10 to M30. The function and effect of the conductor plate 4A in the power switching semiconductor device 3000 is the same as that in the power switching semiconductor device 2000 discussed referring to FIG. 7. Providing the conductor plate 4B produces an effect of further reducing the self-inductances generated in the main electrodes M10 and M20.

For example, when only the conductor plate 4A is provided, the self-inductance is reduced to about two thirds as compared with that in case of no conductor plate, and when both the conductor plates 4A and 4B are disposed with the main electrodes M10 to M30 interposed therebetween, the self-inductance is reduced to about half. This is because the magnetic field caused by the magnetizing current in the conductor plate 4B counteracts the magnetic fields in the inside main surfaces of the main electrodes M10 to M30. The magnetizing current is generated in the conductor plate 4B in the same manner as that in the conductor plate 4A, so no discussion will be presented. Furthermore, other effects of the power switching semiconductor device 3000 are the same as those of the power switching semiconductor device 1000.

The conductor plate 4B may be embedded into the side wall of the case body 101, together with the conductor plate 4A and the main electrodes M10 to M30, and also may be inserted into a pocket provided correspondingly to a position to be provided with the conductor 4B for accommodating it.

Naturally, the conductor plate 4 of FIG. 5 may be provided to be opposed to the outside main surfaces of the main electrodes M10 to M30, instead of the conductor plate 4A as discussed in this preferred embodiment.

<D. The Fourth Preferred Embodiment>

Figure 9:
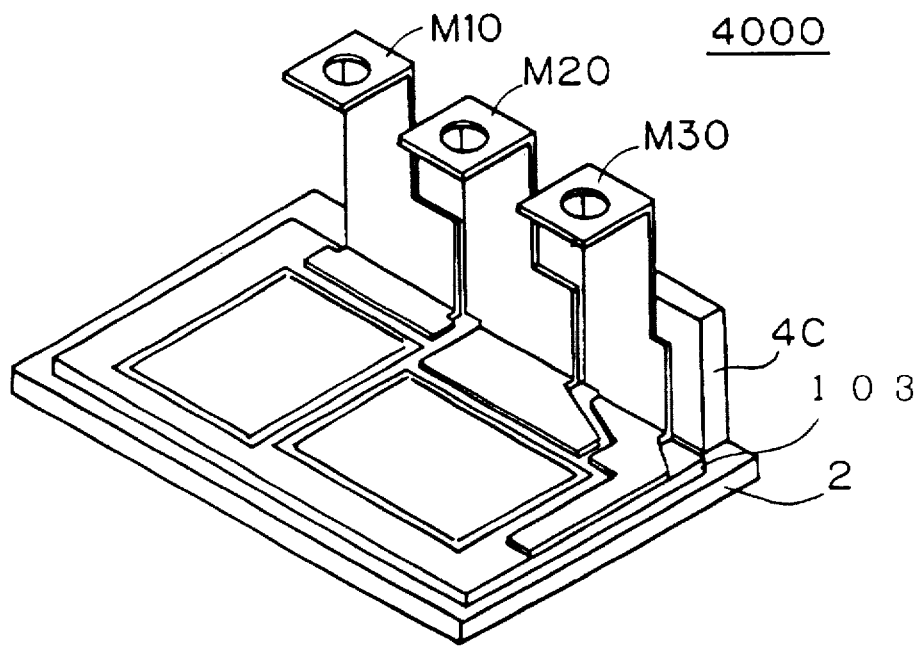
FIG. 9 is a perspective view showing an arrangement of a conductor plate in a semiconductor device in accordance with a fourth preferred embodiment of the present invention.

FIG. 9 is a perspective view showing a configuration of a power switching semiconductor device 4000 as an example of a semiconductor device in accordance with the fourth preferred embodiment of the present invention. The case body 101 is not shown in FIG. 9, and the same elements as those of the power switching semiconductor device 1000 of FIGS. 1 to 5 will not be discussed.

In FIG. 9, the conductor plate 4C is so disposed as to be opposed to the outside main surfaces of the main electrodes M10 to M30. The conductor plate 4C is made of the same material and has the same thickness as the heat sink 2. In other words, part of the heat sink 2 extends to be in parallel to the outside main surfaces of the main electrodes M10 to M30.

Although the conductor plate 4C appears to be part of the heat sink 2 from its material and thickness, they are absolutely different in their function and effect from each other. Specifically, the heat sink 2, which radiates the heat generated by the switching elements T1 and T2 and the diodes D1 and D2 during their operations, is arranged so that its lower surface may come into contact with cooling means not shown in FIG. 10, such as an air-cooled or water-cooled cooling fin.

On the other hand, the conductor plate 4C, which serves to reduce the self-inductance in the main electrodes M10 to M30 by generating the magnetizing current through the magnetic induction, is not required to come into contact with the cooling means. Accordingly, the conductor plate 4C may be embedded into the side wall of the resin case 101 together with the main electrodes M10 to M30. Furthermore, an outside main surface of the conductor plate 4C may be exposed in the side wall of the resin case 101.

Thus, the power switching semiconductor device 4000 enables reduction of the self-inductance generated in the main electrodes M10 and M20, and furthermore achieves higher effect of radiating the heat generated in the conductor plate 4C since the conductor plate 4C is made of the same material and has the same thickness as the heat sink 2. The conductor plate 4C and the heat sink 2 are formed at the same time by bending the heat sink 2 vertically or through a cutting work, to be integral with each other.

The integral formation of the conductor plate 4C and the heat sink 2 ensures higher efficiency in fabrication than the separate formations. Other effects of the power switching semiconductor device 4000 are the same as those of the power switching semiconductor device 1000.

<E. The Fifth Preferred Embodiment>

Figure 10:
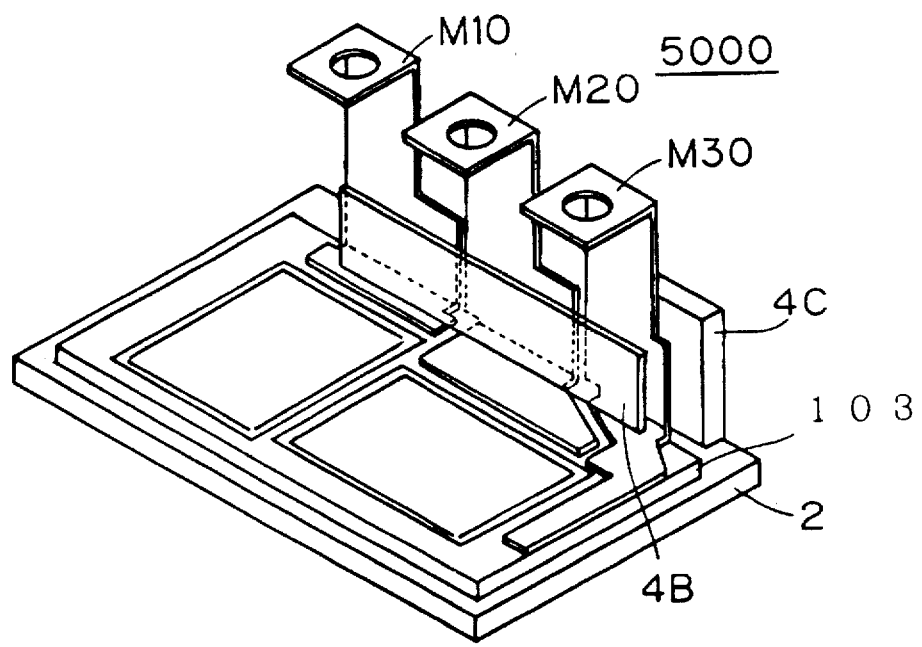
FIG. 10 is a perspective view showing an arrangement of conductor plates in a semiconductor device in accordance with a fifth preferred embodiment of the present invention.

FIG. 10 is a perspective view showing a configuration of a power switching semiconductor device 5000 as an example of a semiconductor device in accordance with the fifth preferred embodiment of the present invention. The case body 101 is not shown in FIG. 10, and the same elements as those of the power switching semiconductor device 1000 of FIGS. 1 to 5 will not be discussed.

In FIG. 10, the conductor plate 4C is so disposed as to be opposed to the outside main surfaces of the main electrodes M10 to M30, and the conductor plate 4B is so disposed as to be opposed to the inside main surfaces of the main electrodes M10 to M30. The function and effect of the conductor plate 4C in the power switching semiconductor device 5000 is the same as that in the power switching semiconductor device 4000 discussed referring to FIG. 9. Providing the conductor plate 4B produces an effect of further reducing the self-inductances generated in the main electrodes M10 and M20. Other effects of the power switching semiconductor device 5000 are the same as those of the power switching semiconductor device 1000.

<F. The Sixth Preferred Embodiment>

Figure 11:
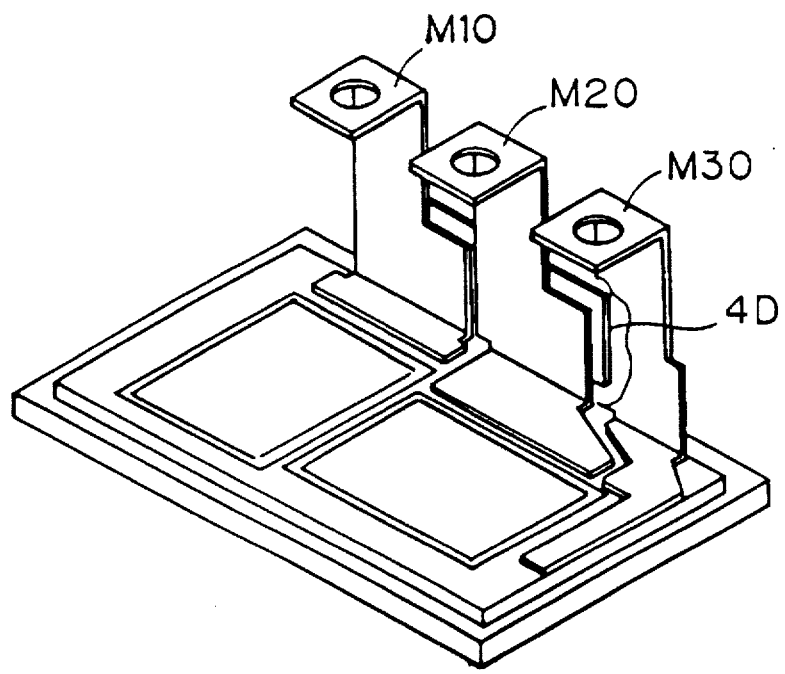
FIG. 11 is a perspective view showing an arrangement of a conductor plate in a semiconductor device in accordance with a sixth preferred embodiment of the present invention.

FIG. 11 is a perspective view showing a configuration of a power switching semiconductor device 6000 as an example of a semiconductor device in accordance with the sixth preferred embodiment of the present invention. The case body 101 is not shown in FIG. 11, and the same elements as those of the power switching semiconductor device 1000 of FIGS. 1 to 5 will not be discussed.

In FIG. 11, a conductor plate 4D is so disposed as to be opposed to the outside main surfaces of the main electrodes M10 and M20. The self-inductance in the main electrode M30 presents no problem as discussed referring to FIG. 6, although the conductor plates are opposed to the outside main surfaces of the main electrodes M10 to M30 in the power switching semiconductor devices 1000 to 5000. Further, even if no conductor is disposed on a position corresponding to the main electrode M30, the self-inductances in the main electrodes M10 and M20 can be reduced without hindrance. Accordingly, the conductor plate 4D in the power switching semiconductor device 6000 has a length enough to be opposed only to the outside main surfaces of the main electrodes M10 and M20.

This configuration allows the conductor plate 4D of smaller area to be used, and therefore ensures a lower manufacturing cost. This effect is pronounced when an expensive material, such as nickel, is used. Other effects of the power switching semiconductor device 6000 are the same as those of the power switching semiconductor device 1000.

<G. The Seventh Preferred Embodiment>

Figure 12:
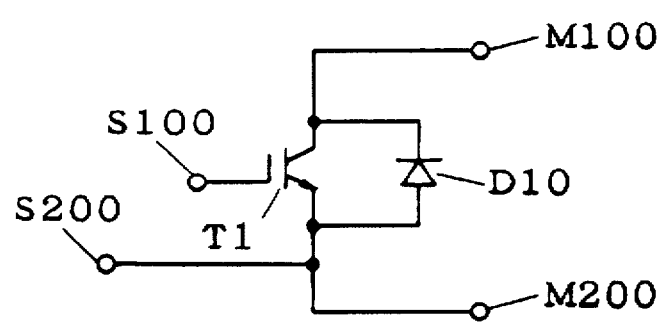
FIG. 12 is a diagram showing a circuit configuration of a semiconductor device in accordance with a seventh preferred embodiment of the present invention.

FIG. 12 illustrates a circuit configuration of a power switching semiconductor device 7000 as an example of a semiconductor device in accordance with the seventh preferred embodiment of the present invention. In FIG. 12, a switching element T10 (IGBT) has a collector electrode connected to a plate-shaped main electrode M100 and an emitter electrode connected to a plate-shaped main electrode M200. Further, the switching element T10 is connected in inverse-parallel to a diode D10.

The gate electrode of the switching element T1 is connected to a signal terminal plate S100 and the emitter electrode thereof is connected to a signal terminal plate S200, serving as an emitter auxiliary terminal to check a voltage of the emitter electrode.

In the power switching semiconductor device 7000 having this configuration, the main current flows only in a direction from the main electrode M100 to the main electrode M200. Accordingly, providing a conductor plate opposed to main surfaces of the main electrodes M100 and M200 enables reduction of the self-inductance.

Figure 13:
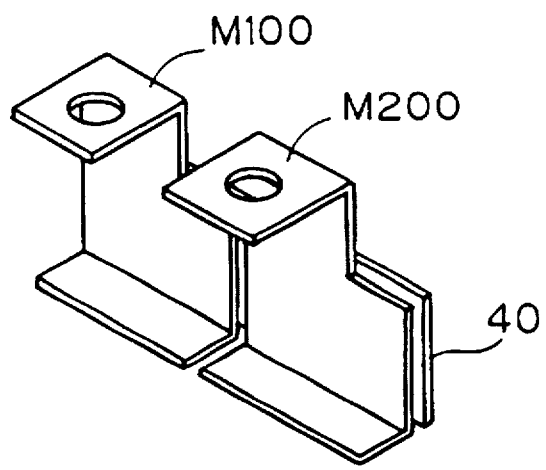
FIG. 13 is a perspective view showing an arrangement of a conductor plate in the semiconductor device in accordance with the seventh preferred embodiment of the present invention.
Figure 14:
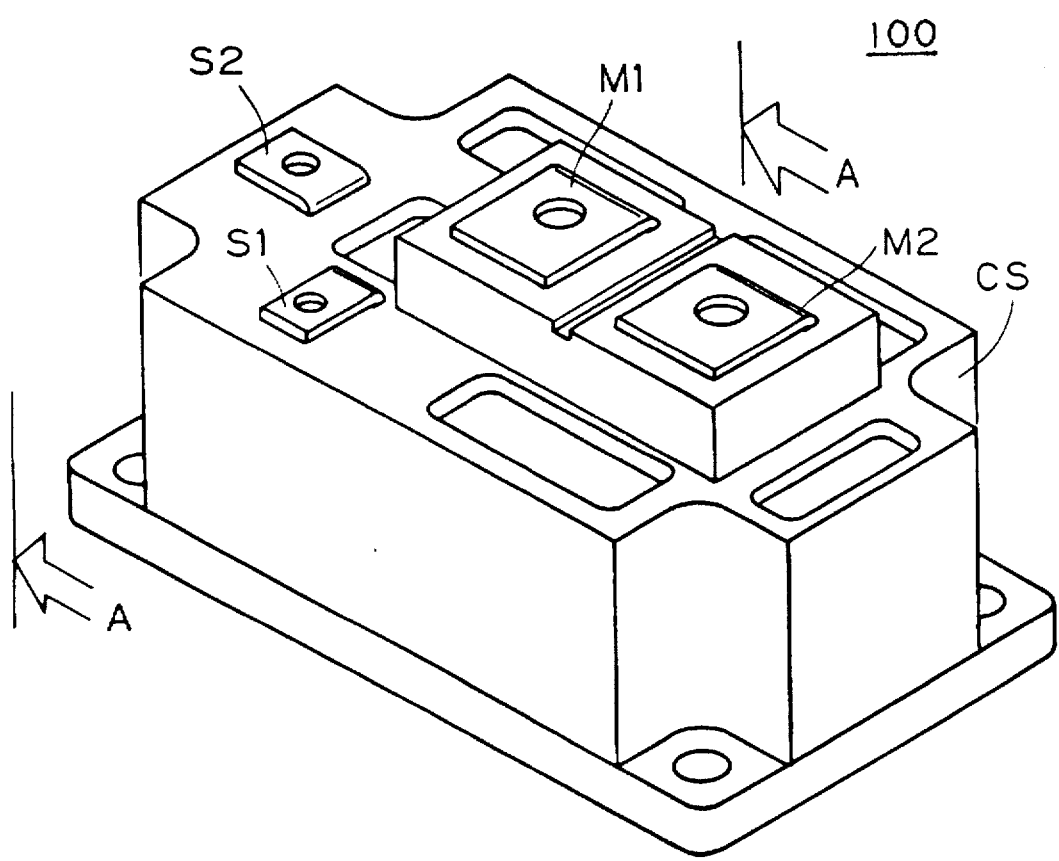
FIG. 14 is an external perspective view of a semiconductor device in the background art.
Figure 15:
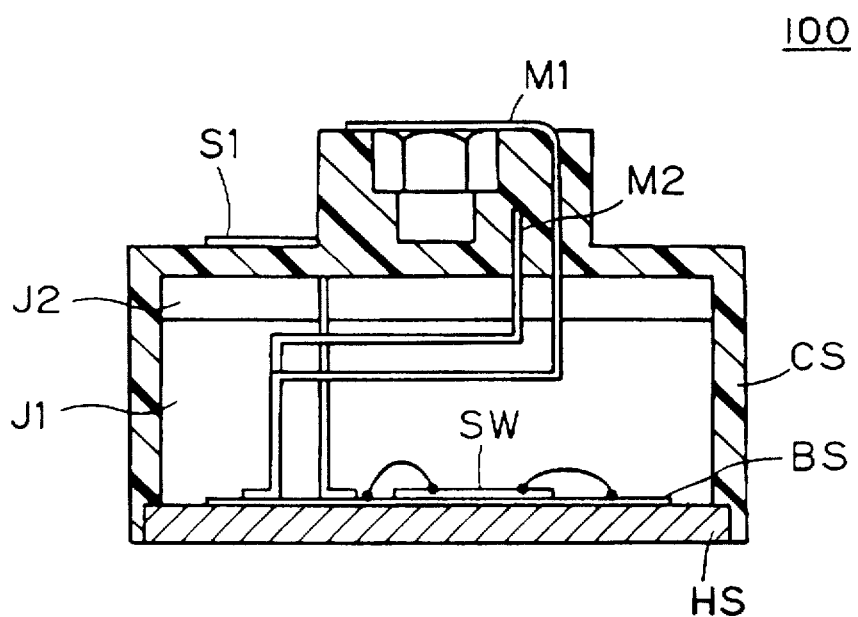
FIG. 15 is a sectional view showing a configuration of the semiconductor device in the background art.
Figure 16:
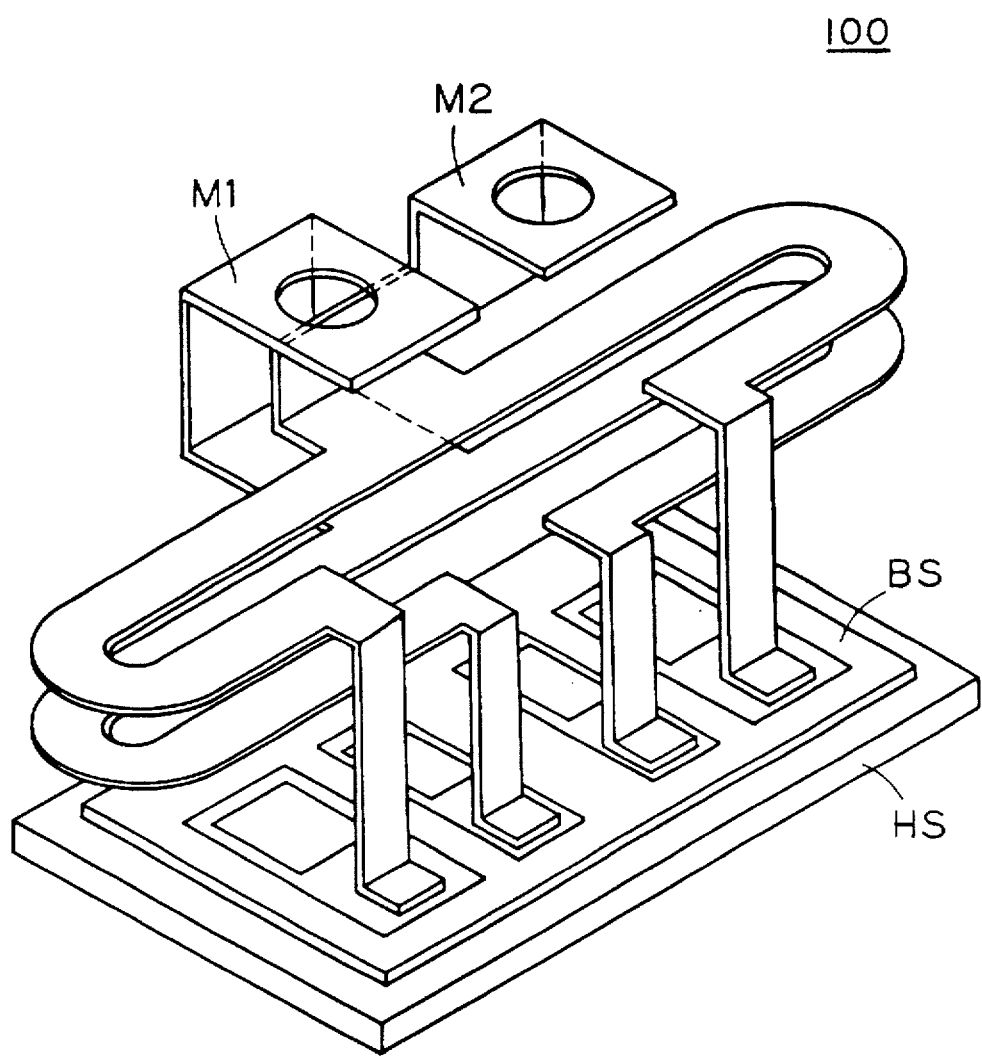
FIG. 16 is a perspective view showing a shape of main electrodes of the semiconductor device in the background art.

FIG. 13 is a perspective view showing an arrangement of the main electrodes M100 and M200 and a conductor plate 40 in the power switching semiconductor device 7000. The insulating substrates and other elements are not shown in FIG. 13 since the arrangement thereof is the same as that in the power switching semiconductor device 1000 of FIG. 5.

In FIG. 13, the conductor plate 40 is so disposed as to be opposed to the outside main surfaces of the main electrodes M100 to M200. With the magnetizing current generated in the conductor plate 40 through the magnetic induction, the self-inductance in the main electrodes M100 and M200 in the power switching semiconductor device 7000 of FIG. 13 is reduced in the same manner as in the power switching semiconductor device 1000 as discussed referring to FIG. 6.

Specifically, in the power switching semiconductor device 1000, the current alternately flows in the main electrodes M10 and M20 in accordance with the on/off operation of the switching elements T1 and T2, while in the power switching semiconductor device 7000, the current flows in the main electrodes M100 and M200 in opposite directions when the switching element T1 is in an on-state.

Consequently, the current flows in the conductor plate 40 through the path indicated by a series of the arrows a-b-g-d-a of FIG. 6, thereby reducing the self-inductances generated in the main electrodes M100 and M200. Other effects of the power switching semiconductor device 7000 are the same as those of the power switching semiconductor device 1000.

Naturally, the conductor plate 40 may be opposed to the inside main surfaces of the main electrodes M100 and M200, instead of the outside main surfaces thereof as shown in FIG. 13, and also may be opposed to both the outside main surfaces and the inside main surfaces thereof.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
   a resin case being box-shaped and electrically insulative;
   a circuit board having a prescribed circuit pattern;
   a power semiconductor element provided on said circuit board; and
   at least one pair of main electrodes, each of said at least one pair of main electrodes having a first main surface and a second main surface which are opposite to each other, and a first end electrically connected to said power semiconductor element and a second end protruding through an upper surface of said resin case, each of said at least one pair of main electrodes flowing a main current from said power semiconductor element in opposite directions; and
   a heat sink for radiating heat generated during an operation of said power semiconductor element,
   wherein said circuit board is provided on said heat sink which is placed on a bottom surface of said resin case;
   wherein each of said at least one pair of main electrodes are so arranged as not to be overlapped to each other, and
   said semiconductor device further comprising a first conductor plate opposed to said first main surfaces of said at least one pair of main electrodes with a prescribed spacing therebetween.

2. The semiconductor device of claim 1, wherein
   said at least one pair of main electrodes are arranged so that said second main surfaces may face a side in which said power semiconductor element is mounted and said first main surfaces may face the opposite side, and
   said first conductor plate is arranged so that its edge portion may be engaged with said heat sink.

3. The semiconductor device of claim 1, wherein
   said at least one pair of main electrodes are arranged so that said second main surfaces may face a side in which said power semiconductor element is mounted and said first main surfaces may face the opposite side, and
   said first conductor plate is formed integrally with said heat sink.

4. The semiconductor device of claim 1, further comprising:
   a second conductor plate opposed to said second main surfaces of said at least one pair of main electrodes with a prescribed spacing therebetween.

5. The semiconductor device of claim 4, wherein
   said at least one pair of main electrodes are arranged so that said second main surfaces may face a side in which said power semiconductor element is mounted and said first main surfaces may face the opposite side, and
   said first conductor plate is arranged so that its edge portion may be engaged with said heat sink.

6. The semiconductor device of claim 4, wherein
   said at least one pair of main electrodes are arranged so that said second main surfaces may face a side in which said power semiconductor element is mounted and said first main surfaces may face the opposite side, and
   said first conductor plate is formed integrally with said heat sink.

7. The semiconductor device of claim 4, wherein
   at least one of said first and second conductor plates and said at least one pair of main electrodes are fixed inside a side wall of said resin case by resin sealing.

8. The semiconductor device of claim 4, wherein
   said at least one pair of main electrodes are fixed inside a side wall of said resin case by resin sealing,
   said resin case includes a pocket provided inside said side wall thereof correspondingly to a position to be provided with at least one of said first and second conductor plates for accommodating at least one of said first and second conductor plates, and at least one of said first and second conductor plates is inserted into said pocket.

9. The semiconductor device of claim 4, wherein said first and second conductor plates each have
a diamagnetic material as a main material; and
a ferromagnetic layer formed over a surface of said main material.

10. The semiconductor device of claim 9, wherein said diamagnetic material is copper, and
said ferromagnetic layer is a thin layer made of nickel.

11. The semiconductor device of claim 4, wherein said first and second conductor plates each have
a paramagnetic material as a main material; and
a ferromagnetic layer formed over a surface of said main material.

12. The semiconductor device of claim 11, wherein said paramagnetic material is aluminum, and
said ferromagnetic layer is a thin layer made of nickel.

13. The semiconductor device of claim 4, wherein said first and second conductor plates are each made of paramagnetic material.

14. The semiconductor device of claim 13, wherein said paramagnetic material is aluminum.

15. The semiconductor device of claim 4, wherein said first and second conductor plates are each made of ferromagnetic material.

16. The semiconductor device of claim 15, wherein said ferromagnetic material is an alloy of nickel.

* * * * *